United States Patent [19]
Nelson et al.

[11] Patent Number: 5,369,373
[45] Date of Patent: Nov. 29, 1994

[54] COMB DATA GENERATION

[75] Inventors: George F. Nelson, Coon Rapids; David P. Andersen, Burnsville, both of Minn.

[73] Assignee: Unisys Corporation, Blue Bell, Pa.

[21] Appl. No.: 961,986

[22] Filed: Oct. 16, 1992

[51] Int. Cl.$^5$ .............................................. H03H 19/00
[52] U.S. Cl. .................... 327/121; 333/173; 327/557; 327/558
[58] Field of Search ............... 328/17, 18, 167; 307/520, 521; 333/167, 204, 205, 173, 174

[56] References Cited

U.S. PATENT DOCUMENTS

| | | | |
|---|---|---|---|
| 3,691,486 | 9/1972 | Borsuk et al. | 328/167 |
| 3,777,271 | 12/1973 | Telewski | 328/16 |
| 3,806,811 | 4/1974 | Thompson | 325/146 |
| 4,319,207 | 3/1982 | Gignoux | 333/173 |
| 4,342,008 | 7/1982 | Jewett | 331/49 |
| 4,623,856 | 11/1986 | Bickley et al. | 333/205 |
| 4,723,306 | 2/1988 | Fuefgelder et al. | 455/103 |
| 5,115,215 | 5/1992 | Koontz | 333/103 |
| 5,307,029 | 4/1994 | Schenk | 328/17 |

*Primary Examiner*—Andrew M. Dolinar
*Attorney, Agent, or Firm*—Glenn W. Bowen; Mark T. Starr; Charles A. Johnson

[57] ABSTRACT

A sine wave oscillator provides an input signal to a step-recovery diode (SRD). The SRD produces a wideband series of harmonics of the frequency of the sine wave oscillator that are represented as "lines" in a power r.f. frequency plot. The output of the SRD is supplied to one or more bandpass filters or lowpass filters which provide selection windows so that only a specified number of harmonic lines are passed within a selection window. These specified harmonic lines are then coupled to one or more high speed input switches which are coupled to one or more high speed selection switches. The high speed selection switches are each coupled to a separate bandpass filter that is tuned to a different bandpass frequency range. Each bandpass filter corresponds to one or to several adjacent lines of the selection windows. The selection switches are connected so that various ones of them may be turned on to form either selective parallel or serial combinations, or even simultaneous parallel/serial compositions, of the frequency line components under the control of a digital switch controller. The output of the bandpass channel filters are coupled to a broadband output r.f. amplifier so chat transmission of the desired output signal may be made from the amplifier either over a wire or by wireless transmission. An amplitude level controller for limiting the amplitudes of selected frequency lines and a phase modulator for phase-modulating the output frequency line components are optional features.

27 Claims, 3 Drawing Sheets

COMB DATA GENERATION

BACKGROUND OF THE INVENTION

The field of the invention is the transmission of analog and digital information by electrical signals. More particularly, the invention is related to comb spectral generators which may be utilized for a wide variety of applications, including frequency-hopping communications, data links, vehicle collision avoidance systems, analog and digital encoder transmissions, selective identification systems and precise waveform generators.

A comb spectral generator is an electronic device which generates a harmonic frequency signal series for a line spectrum of frequencies that may extend well into the upper GHz ranges. Comb spectral generation may be achieved by use of a snap-back or step recovery diode (SRD) which is biased to a predetermined operating point and has an input coupled to a periodic electrical signal generator, such as a sine wave generator. The SRD is a microwave diode which has steep doping profiles and narrow junctions to maximize charge-storage effects. This leads to fast recovery of injected charge, typically in a transition period of a few tenths of a nanosecond. This results in the exceptionally efficient production of harmonics of the frequency of the input signal generator. Present day versions of the SRD have a relatively low breakdown voltage which limits the power capability of the diode, thus making communication systems based on the SRD ideal for limited range applications.

The use of an SRD for harmonic generation is a known technique, as shown in U.S. Pat. No. 3,777,271, issued Dec. 4, 1973, in the name of Frederick John Telewski, and entitled "Generation of Microwave Frequency Combs with Narrow Line Spacing." In the Telewski patent prior art is discussed in which a microwave comb generator is constructed by utilizing an SRD and associated circuit elements which are driven by a sine wave input generator.

In operation, SRD's are alternately forward and then reversed biased. When they are forward-biased current flows through the diode junction. When they are reversed-biased current is swept from the diode junction by minority charge carriers. This action produces a transient pulse which is very high in harmonics. An SRD produces frequency components which are integral multiples of the input signal frequency such that when these frequency components are plotted in an amplitude versus frequency plot, sharply defined lines representing these frequency components are formed.

As noted in the Telewski patent, SRD multipliers operate well above frequencies above 10 MHz, although signal strength in general decreases with increasing harmonic frequency order and becomes too low to be useful at about 150-200 lines. It is also noted that the minimum obtainable comb line spacing is about one-half to one percent of the frequency of the uppermost useful comb line.

The Telewski patent describes a device in which the conventional comb SRD generator is driven simultaneously by two or more signals of different frequencies to produce two or more different combs with line spacings that correspond to the respective drive signal frequencies. Since the comb generator is inherently a nonlinear device, it produces the intermodulation products of the different combs which results in a composite comb that consists of lines that are spaced by the difference between the frequencies of the two driving signals.

Step-recovery diodes, or impulse train generators, are available from Hewlett Packard which may be driven at various drive frequencies of 100, 250,500 and 1000 MHz. These impulse train generators generate useful power at harmonics through 18 GHz. Some types of SRD's require an external bias, but the Hewlett Packard models designated by them as 33002A/B, 33003A/B, 33004A/B and 33005C/D are self-biased. Either an externally biased SRD or a self-biased SRD may be employed in the present invention.

U.S. Pat. No. 3,806,811 entitled "Multiple Carrier Phase Modulated Signal Generating Apparatus," issued Apr. 23, 1974 to Wallace T. Thompson employs an SRD in which a "pump" signal is phase-modulated and is used to drive the SRD so that all of the spectral lines of the comb have the same modulation on them. The addition of phase-modulation of the SRD is a feature which may be incorporated into the present invention for various applications, if desired.

High speed switches are also required in the present invention. One type of suitable switch is the "positive-intrinsic-negative diode" or PIN diode. These devices have a region of intrinsic semiconductor material (equal hole and election charge carriers) intermediate P-type and N-type regions. When a forward bias is applied across the intrinsic region, the diode resistance drops very fast allowing PIN diodes to be used as high speed switches. Through the application of appropriate voltages, these diodes may be made to conduct or inhibit the conduction of r.f. signals. PIN switches have a number of desirable features, including that they are broadband devices that are fast switching and have high isolation and ultra-low power consumption. Consequently, they have been used in a number of applications where advantage may be taken of these characteristics.

Other types of high speed switches that may be employed in the invention are Field Effect Transistor (FET) switches, particularly Gallium Arsenide switches.

PIN diodes are also useful in the present invention to provide, if desired, amplitude-limiting and phase-modulation of the comb lines.

U.S. Pat. No. 4,623-856, entitled "Incrementally Tuned R.F. Filter Having Pin Diode Switched Lines," issued Nov. 18, 1986 to Robert H Bickley, et. al., describes an r.f. filter in which the filter frequency is adjusted using PIN diodes.

U.S. Pat. No. 4,723,306, issued Feb. 2, 1988, entitled "Wide Band Transmitter for Short Electro-Magnetic Waves," issued in the name of Helmut Fuenfgelder, et al., describes a transmitter in which PIN diodes are used as electronic switches.

U.S. Pat. No. 4,342,008 entitled "Switched Tunable Frequency Multiplier," issued Jul. 27, 1982 in the name of Robert E. Hewitt, describes the use of a PIN diode for connecting the output coupling loop to a YIG tuned frequency multiplier-to-ground.

U.S. Pat. No. 5,115,215 entitled "PIN Diode Activation Method and Apparatus," issued May 19, 1992 to Floyd A. Koontz, shows a device in which PIN diodes can be selectively made conductive to shunt the input terminals of a device so that the device is thereby effectively bypassed.

PIN diode fast-switching switches are commercially available. They may be provided also by over-driving variable gain, wideband amplifiers that utilize PIN diodes. Representative amplifiers of this type are sold by Hewlett Packard under the designations HAMP 4001/4902.

SUMMARY OF THE INVENTION

A step-recovery diode (SRD) is coupled to a periodic signal source, such as a sine wave oscillator. The output of the SRD is a series of harmonic frequency components of the frequency of the oscillator that extend over a wide frequency band and are known as "lines". The output of the SRD is supplied to one or more bandpass filters or lowpass filters which provides selection windows, so that only a specified number of harmonic lines are passed within a selection window. These frequency lines are then combinable into a large variety of selected parallel, serial or parallel/serial combinations of the frequency lines through circuitry that utilizes selection filters and high speed switches under the control of a digital switch controller. Amplitude limiting and phase-modulation are optional features.

BRIEF DESCRIPTION OF THE DRAWINGS

The present invention is described by reference to the drawings in which.

DETAILED DESCRIPTION OF THE PREFERRED EMBODIMENT

Figure 1:
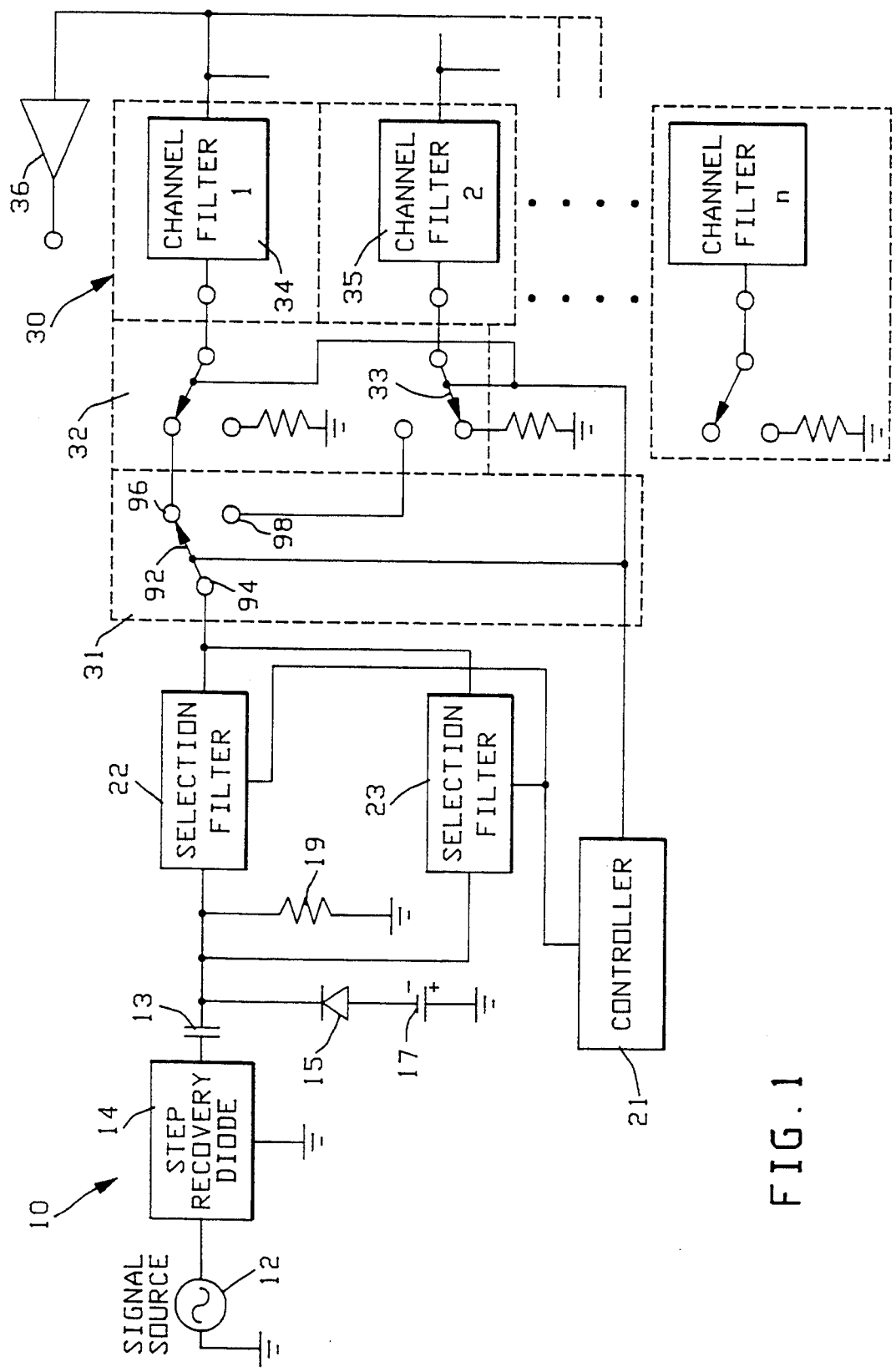
FIG. 1 is a block diagram of the present invention.

This invention system is for transmission of analog or digital information. It is intended to provide limited distances along with the ability to encode the transmission for security, if necessary. It is intended to be used with existing support equipment to provide discrete control signals and for information processing. In identification applications, it may be self-contained with a simple means of resetting the coding.

A sine wave generator is used to periodically charge the junction of the Step Recovery Diode (SRD). The generator alternately provides forward-bias and junction current then reverse-bias for the SRD. The period of the generator provides the repetition rate of the pulsed output energy of the datalink. As the period of the generator is varied, the repetition rate of the transmitted r.f. output signals varies which may be at digitally controlled rates. The SRD is a very efficient means of providing harmonic multiplication of a significantly lower reference frequency. The high number of integral multiples of the generator signal produces a "comb" of discrete frequencies spaced apart by the frequency of the generator.

In the described embodiment, the number of harmonics desired for data transmission purposes is selected by a bandpass filter. The selected harmonics are passed through the bandpass filter to individual filters for each of the desired harmonics. Each of the individual filters has a PIN, FET or other high speed switch attached to it to electrically control whether the filter will allow that particular harmonic frequency through or not. Therefore, the specific harmonics may be electrically switched on or off at the output of the datalink. This produces an output on each of the harmonic frequencies desired, while each of the harmonic frequencies can be turned on and off selectively at will.

If the filters for selected harmonics were turned on and off in response to a digital code, this datalink could communicate digital information. If the harmonics of data transmission are turned on and off in a pseudorandom or prescribed coded pattern, then this datalink can serve as a frequency hopping datalink with spread spectrum capabilities.

Since the individual harmonic filters are reactive elements, a variable capacitance diode may be attached to the filter to vary the reactance producing a phase modulation capability on selected filters, which could be used to transmit analog modulated information, such as voice, while the other harmonic signals are communicating digital data.

A variation of this datalink can be used as a transponder for aircraft or other vehicles to automatically respond when it receives the proper signals from another station. In this application, it could perform as an anti-collision device which would transmit its Global Positioning System (GPS) derived location to another station when interrogated. The position would then be entered into a personal computer along with other aircraft in the vicinity resulting in a central facility having the ability to keep aircraft separated a safe distance from each other with no radar or ground controller necessary.

Another variation of this system would be used as an inexpensive GHz limited range battlefield identification system for friendly forces. The datalink could use the specific generator frequency together with selected harmonic outputs to provide a coded response to a similar system on an attacking weapon system. The coding of the harmonic output and the generator frequency, or repetition rate, could be changed as necessary to keep the system secure in the battlefield.

The frequency hopping capability together with an analog modulation technique and limited output power would allow a low probability intercept communications system for limited distance in the GHz frequency range. The potential for very small size through the use of ASIC's and chips with stripline filters on ceramic substrates could result in a package approximately 3 inches square by less than 1 inch high.

A schematic diagram of an embodiment of the comb data generator and transmitter 10 of this invention is shown in FIG. 1. The input to the data generator and transmitter may be supplied by a periodic frequency signal source 12, such as a sine wave oscillator. The signal source 12 is coupled to a step recovery diode (SRD) 14. If the SRD is of the type that requires an external bias voltage, a suitable resistor biasing network of the type that is well known to those skilled in the art must be provided. It is preferred, however, that a self-biased SRD, such as those previously mentioned as being available from Hewlett Packard, be employed, as shown in FIG. 1.

Figure 2:
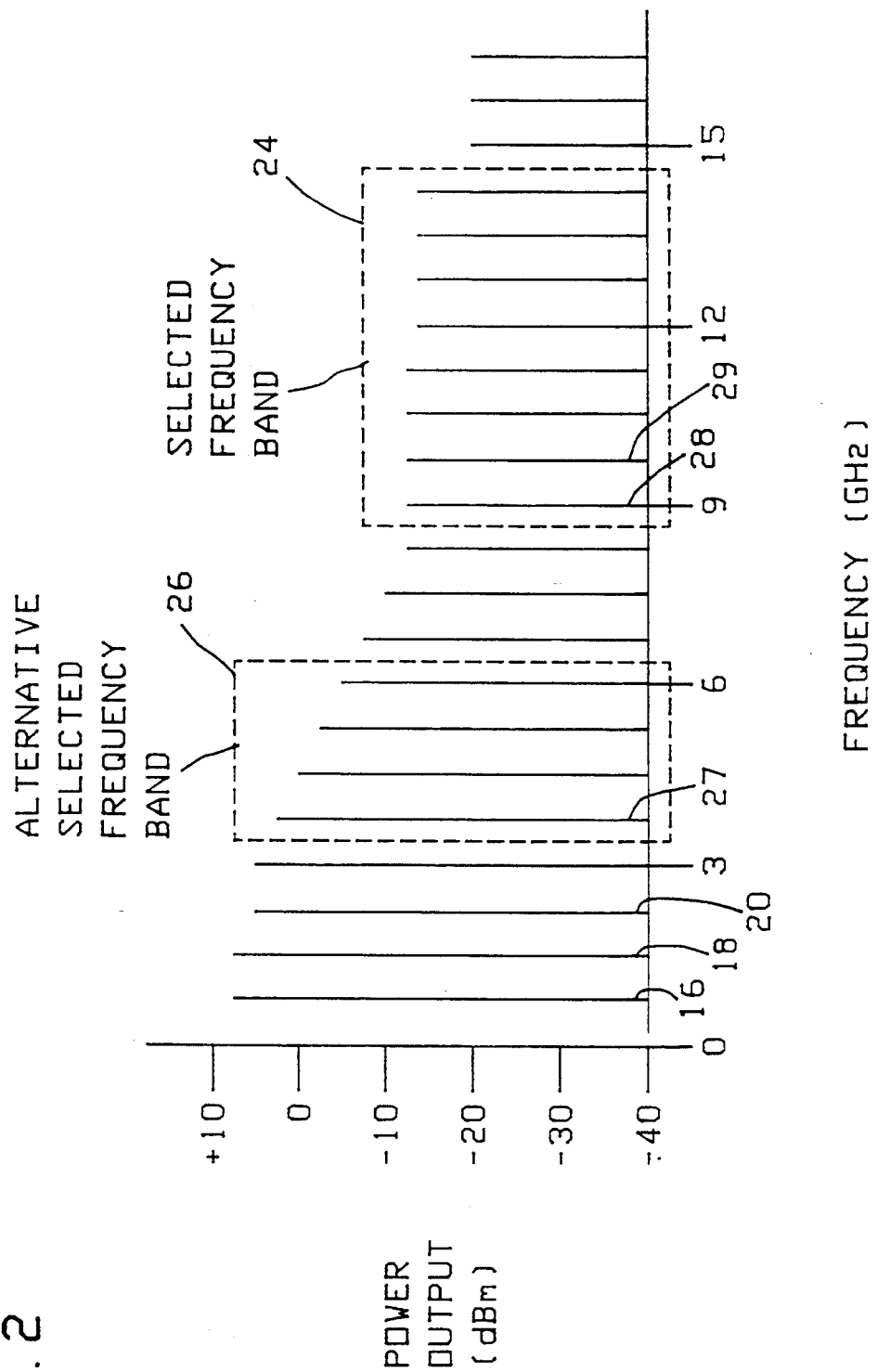
FIG. 2 is an amplitude versus frequency plot of the spectrum lines produced by the step-recovery diode of FIG. 1 which also illustrates how frequency lines may be grouped for transmission.

The output of the SRD, as noted in the Background of the Invention section, provides a series of frequency components, or lines, which are harmonic frequencies of the input signal source frequency. FIG. 2 shows an illustrative example plot of the power output of an SRD versus frequency in GigaHertz (GHz) of the harmonic lines. The frequency of the sinusoidal input signal source is represented by the line 16. The line 18 is thus the second harmonic of the frequency 16, and the line 20 is the third harmonic frequency and so on where each additional line to the right represents the next higher harmonic frequency of the signal source.

The output of the SRD is coupled to a selection filter 22 which may select any group of adjacent frequency lines that are produced by the SRD. For example, the selection filter 22 may select all of the lines that are illustrated as lying in the dotted box 24 of FIG. 2. These lines represent the 12th through 19th harmonic frequencies of the signal source 12. Additional selection filters, such as the selection filter 23, may be coupled in parallel with the selection filter 226 and used to select either alternately, or simultaneously, one or more additional frequency bands, such as the frequency band 26, which includes the 5th through 8th harmonic frequencies of the signal source 12.

It is noted that the power output, and hence the signal amplitude, for the various lines of FIG. 2 are at different levels. It may be desirable to maintain this amplitude difference for certain applications, or it may be desirable to include amplitude limiting circuitry. One suitable limiter in which the cathode of the PIN diode 15 is connected to the output of the SRD, and the anode of the PIN diode is connected to variable voltage supply 17 for this purpose is shown in FIG. 1. Adjustment of the voltage supply 17, which has its negative side connected to the anode of the PIN diode 15 and its positive side connected to ground, sets the level at which amplitude limiting occurs. Capacitor 13 provides D.C. isolation for the SRD from the voltage supplied to the PIN diode (15) by the voltage supply 17. Resistor 19 develops the signal voltage for the output lines from the capacitor 13.

The output of the selection filter 22 and/or 23 is controlled by the controller 19 and is provided to an array of "n" (where n is any number) signal processing units 30 through one or more high speed input switches. Each unit 30 consists of a suitable fast-switching selection switch 32 and a channel filter 34. Suitable types of high speed, fast-switching switches include positive-intrinsic-negative PIN switches and field effect transistor (FET) switches. In the illustrated embodiment the selection switches 32, 33 are illustrated schematically. Each selection switch, such as the switches 32, 33, is connected to a separate channel filter, such as the filters 34, 35. These channel filters are highly selective bandpass filters which preferably select one line, such as the lines 27, 28, (but could select more than one of the adjacent lines, if desired), within a selected frequency band, such as the bands 24, 26 of FIG. 2.

The selection switch 32 of FIG. 1 connects the channel filter 34 to the output of the selection filter 22 via the input switch 31. Alternate embodiments of the invention may include additional input switches and a number of selection filters which could be connected to different channel filters according to the desired application.

Figure 3:
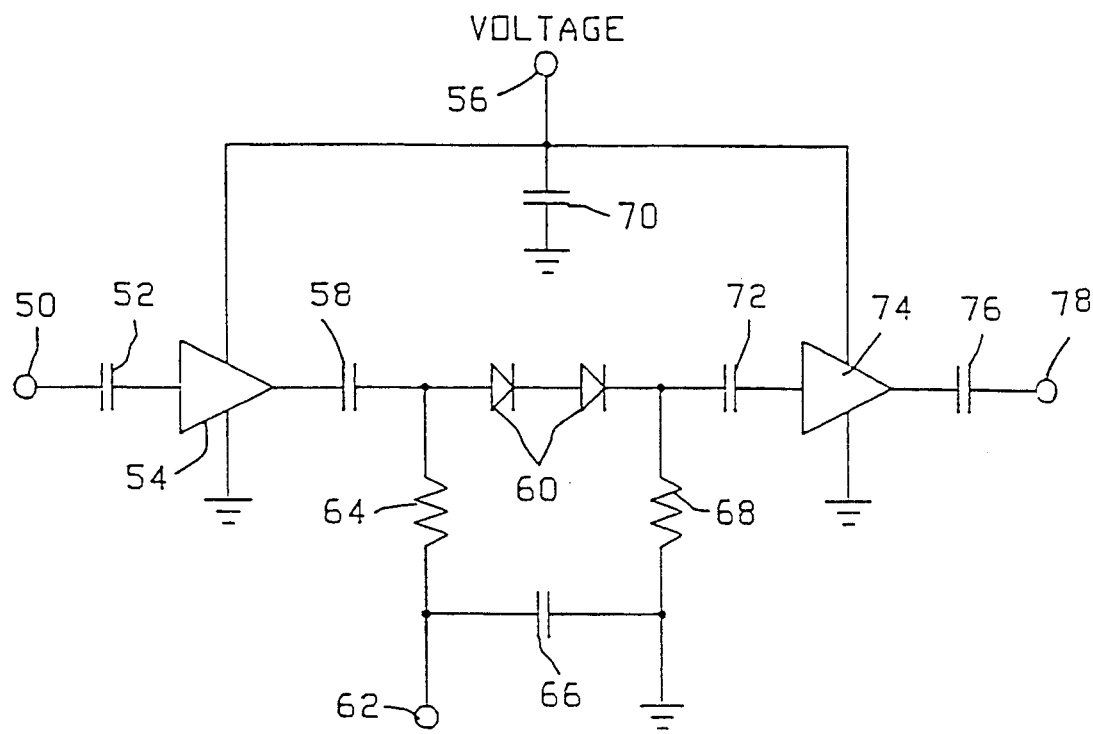
FIG. 3 is a schematic diagram of a PIN diode circuit that may be used in the present invention as a high speed switch.

The switches 31, 32, 33 and the other switches of the invention may be implemented, as previously mentioned, by overdriving variable gain, wideband amplifiers. FIG. 3 shows a schematic of the aforementioned Hewlett Packard amplifier. A signal is supplied to the input terminal 50 through a coupling capacitor 52 to an amplifier 54. A supply voltage for the amplifier is coupled to the terminal 56. The output of the amplifier 54 is coupled through another coupling capacitor 58 through the anode of one or more PIN diodes in series 60. The number of PIN diodes that are utilized depends on the operating conditions of the circuit. Input switching voltage is supplied to the terminal 62 through an input circuit that consists of the resistor 64, the filtering capacitor 66 and the resister 68. A filtering capacitor 70 is also connected to voltage supply terminal 56. The output of the last PIN diode in the chain is supplied through the coupling capacitor 72 to a second amplifier 74, which is also coupled to the supply voltage at the terminal 56. The output of the amplifier 74 is supplied through the coupling capacitor 76 to the output terminal 78. The circuit of the schematic may be utilized as a variable gain, wideband amplifier, but it may also be utilized as a fast-switching PIN diode switch in the embodiment of FIG. 1 by over-driving the control signal supplied to the terminal 62.

Phase-modulation may also be obtained with the present invention for all of the line frequencies in a selected frequency band, or for only selected ones of them, as desired, in order to provide complex signals. A very efficient bandwidth allocation can be obtained with such complex signals which are useful to provide for several different layers of information transmission in a secure manner.

Figure 4:
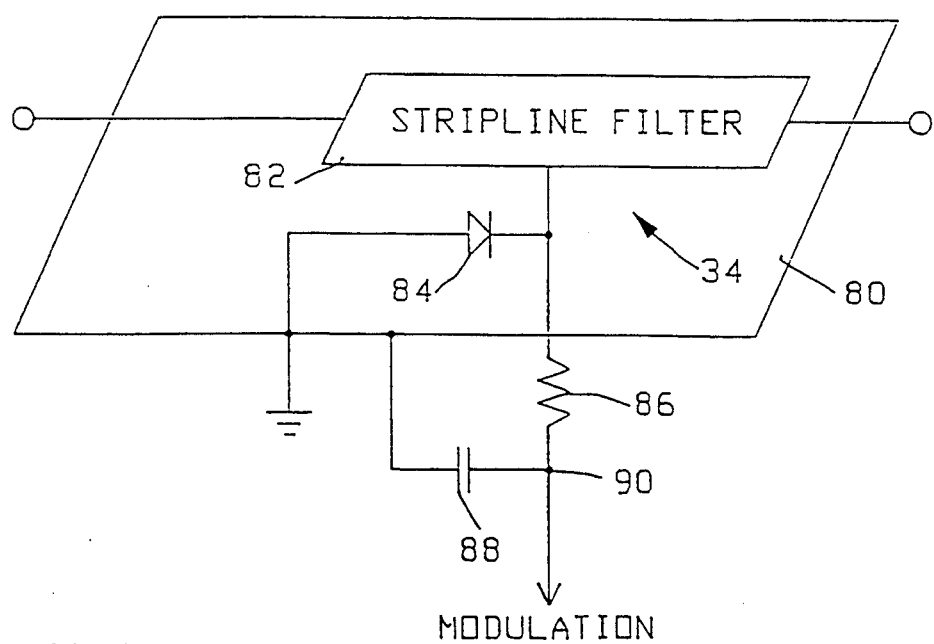
FIG. 4 is an expanded schematic showing of a stripline channel filter and an associated phase-modulator circuit that may be employed in the block diagram embodiment of FIG. 1.

Phase-modulation may be obtained if the filter, such as the channel filters 34, 35, and the other channel filters which are represented by the black dots below the channel filter 35 are constructed of stripline filters, as illustrated in FIG. 4. The distributed inductance and capacitance of a stripline filter provides the desired bandpass characteristics. In such a filter a large ground plane 80 is employed adjacent the stripline plane 82. Voltage modulation of a stripline channel filter is achieved by the PIN diode 84 which is connected so that its cathode is connected to the stripline plane 82 and its anode is connected to the ground plane 80. The cathode of the PIN diode 84 is also connected to resistor 86 which is connected at its other end to a terminal to which a voltage modulation signal is supplied. A filtering capacitor 88 may also be coupled between the voltage modulation terminal 90 and the ground plane 80. Inductance phase modulation is obtained on the line frequency that is associated with any given channel filter is thereby obtained.

When the selections switch 32 is selected in the described version of this invention, the input switch 31 is shown such that its armature 92 is connected between the terminals 94 from the selection filter 22 and the terminal 96 to the selection switches. The input terminal of all of the other switches in the embodiment of FIG. 1, such as the terminal 98, for the selection switch 33 are, therefore, open when the selections witch 32 is selected. Thus, in the described embodiment, one of the selection switches is connected through the input switch 31 to the selection filters one at a time.

The invention has potential use in a number of applications, including inexpensive collision avoidance, identification transponders, remote controllers for limited ranges, datalinks, frequency hopping communication systems. It is readily apparent from the teachings of this document that a number of input switches 31 and a number of selection switches may be coupled with a wide variety of permutation patterns to construct many different types of parallel, series, parallel/series modulated, unmodulated, amplitude-limited and non-amplitude-limited electrical output signals which will be within the scope of this invention.

What is claimed is:

1. A comb data generation system comprising,
   a sine wave source having an output constructed to produce an electrical signal of a predetermined frequency at its output,
   a harmonic series line generating means having an input coupled to the output of said sine wave source and an output constructed to produce a wideband series of harmonic lines of said predetermined frequency,
   selection filter means having an input coupled to the output of said harmonic series line generating means and an output constructed to select at least one selected band of n adjacent lines of said wideband series of lines,
   a plurality of channel filter means each having an input and an output, and each of which is capable of selecting m line groups, each of which consists of one line or more than one adjacent lines within at least one selected band, as desired, wherein m is equal to or less than n,
   switch means constructed for selectively coupling the outputs of said selection filter means to the inputs of said channel filter means,
   controller means coupled to said switch means constructed to control the selection coupling of said selection filter means to said channel filter means, and
   output means coupled to the output of said channel filter means for providing composite output signals.

2. A comb data generation system as claimed in claim 1 comprising signal limiting means coupled between a reference voltage and the output of said harmonic series line generating means.

3. A comb data generating system as claimed in claim 2 wherein said signal limiting means comprises a positive-intrinsic-negative (PIN) diode and a D.C. voltage supply coupled in series with said PIN diode.

4. A comb data generating system as claimed in claim 1 comprising voltage modulation means coupled between a modulation voltage source and at least one of said channel filter means.

5. A comb data generation system as claimed in claim 4 comprising signal limiting means coupled between a reference voltage and the output of said harmonic series line generating means.

6. A comb data generating system as claimed in claim 5 wherein said signal limiting means comprises a positive-intrinsic-negative (PIN) diode and a D.C. voltage supply coupled in series with said PIN diode.

7. A comb data generating system as claimed in claim 4 wherein at least some of said channel filter means comprise stripline filter means, and said voltage modulation means comprises a positive-intrinsic-negative (PIN) diode having one node coupled to a modulation voltage source and said stripline filter means and at its other node coupled to a reference voltage.

8. A comb data generating system as claimed in claim 7 comprising signal limiting means coupled between a reference voltage and the output of said harmonic series line generating means.

9. A comb data generating system as claimed in claim 8 wherein said signal limiting means comprises a positive-intrinsic-negative (PIN) diode and a D.C. voltage supply coupled in series with said PIN diode.

10. A comb data generating system as claimed in claim 1 wherein said harmonic series line generating means comprises a step recovery diode (SRD).

11. A comb data generation system as claimed in claim 10 comprising signal limiting means coupled between a reference voltage and the output of said harmonic series line generating means.

12. A comb data generating system as claimed in claim 11 wherein said signal limiting means comprises a positive-intrinsic-negative (PIN) diode and a D.C. voltage supply coupled in series with said PIN diode.

13. A comb data generating system as claimed in claim 10 comprising voltage modulation means coupled between a modulation voltage source and at least one of said channel filter means.

14. A comb data generation system as claimed in claim 13 comprising signal limiting means coupled between a reference voltage and the output of said harmonic series line generating means.

15. A comb data generation system as claimed in claim 14 wherein said signal limiting means comprises a positive-intrinsic-negative (PIN) diode and a D.C. voltage supply coupled in series with said PIN diode.

16. A comb data generation system as claimed in claim 13 wherein at least some of said channel filter means comprise stripline filter means, and said voltage modulation means comprises a positive-intrinsic-negative (PIN) diode having one node coupled to a modulation voltage source and said stripline filter means and its other node coupled to a reference voltage.

17. A comb data generation system as claimed in claim 16 comprising signal limiting means coupled between a reference voltage and the output of said harmonic series line generating means.

18. A comb data generating system as claimed in claim 17 wherein said signal limiting means comprises a positive-intrinsic-negative (PIN) diode and a D.C. voltage supply coupled in series with said PIN diode.

19. A method of comb data generation comprising:
    producing a harmonic series of lines of a predetermined sine wave signal frequency,
    selecting at least one limited band of said harmonic series of lines,
    selecting more than one of said lines, and
    combining said selected lines to form composite signals such that such composite signals are formed from either
    (a) one line in one selected band and at least one line in at least one other selected band, or
    (b) a series of adjacent lines in one selected band either alone or in combination with
      (1) at least one line in at least one other selected band, or
      (2) at least one series of adjacent lines in at least one other selected band.

20. A method of comb data generation as claimed in claim 19 comprising modulating at least one selection line before said selected lines have been combined to form said component signal.

21. A comb data generation system comprising,
    a sine wave source having an output constructed to produce an electrical signal of a predetermined frequency at its output,
    a harmonic series line generating means having an input coupled to the output of said sine wave source and an output constructed to produce a wideband series of p harmonic lines of said predetermined frequency, selectable filter means constructed to select a predetermined plurality of m lines of said wideband series of lines wherein m is less than p, selection means constructed for selectively controlling the selection of said filter means, and output means coupled to the output of said filter means for providing composite output signals.

22. A comb data generation system as claimed in claim 1 comprising signal limiting means coupled between a reference voltage and the output of said harmonic series line generating means.

23. A comb data generating system as claimed in claim 2 wherein said signal limiting means comprises a positive-intrinsic-negative (PIN) diode and a D.C. voltage supply coupled in series with said PIN diode.

24. A comb data generation system as claimed in claim 21 comprising voltage modulation means coupled to a modulation voltage source and to said selective filter means.

25. A comb data generating system as claimed in claim 24 wherein said selectable filter means comprises at least one stripline filter means, and said voltage modulation means comprises a positive-intrinsic-negative (PIN) diode having one node coupled to a modulation voltage source and said stripline filter means and its other node coupled to a reference voltage.

26. A comb data generation system as claimed in claim 24 comprising signal limiting means coupled between a reference voltage and the output of said harmonic series line generating means.

27. A comb data generating system as claimed in claim 26 wherein said signal limiting means comprises a positive-intrinsic-negative (PIN) diode and a D.C. voltage supply coupled in series with said PIN diode.

* * * * *

UNITED STATES PATENT AND TRADEMARK OFFICE
CERTIFICATE OF CORRECTION

PATENT NO. : 5,369,373
DATED : November 29, 1994
INVENTOR(S) : George F. Nelson, David P. Andersen It is certified that error appears in the above-indentified patent and that said Letters Patent is hereby corrected as shown below:

Column 3 line 3 delete "4902" and substitute -- 4002 -- .

Signed and Sealed this

Seventh Day of February, 1995

*Attest:*

BRUCE LEHMAN

*Attesting Officer*  *Commissioner of Patents and Trademarks*